(12) United States Patent
Kim

(10) Patent No.: US 7,135,935 B2
(45) Date of Patent: Nov. 14, 2006

(54) HYPER-RING OSCILLATOR

(75) Inventor: Kyu-Hyoun Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 10/841,866

(22) Filed: May 6, 2004

(65) Prior Publication Data

US 2005/0057316 A1   Mar. 17, 2005

(30) Foreign Application Priority Data

Sep. 16, 2003   (KR) .................... 10-2003-0064241

(51) Int. Cl.
   *H03K 3/03*   (2006.01)
(52) U.S. Cl. .................... 331/57; 331/74; 331/DIG. 3; 713/503
(58) Field of Classification Search ............. 331/57, 331/74, DIG. 3; 713/503
   See application file for complete search history.

(56) References Cited

U.S. PATENT DOCUMENTS

| 5,250,914 | A  |   | 10/1993 | Kondo |
| 5,592,126 | A  | * | 1/1997  | Boudewijns et al. ......... 331/45 |
| 6,100,763 | A  |   | 8/2000  | Durec et al. |
| 6,898,726 | B1 | * | 5/2005  | Lee ............................. 713/503 |

OTHER PUBLICATIONS

Seog-Jun Lee, et al. "A Novel High-Speed Ring Oscillator for Multiphase Clock Generation Using Negative Skewed Delay Scheme" IEEE Journal of Solid-State Circuits, Feb. 1997, pp. 289-291.

* cited by examiner

*Primary Examiner*—Michael B Shingleton
(74) *Attorney, Agent, or Firm*—Marger Johnson & McCollom, P.C.

(57) ABSTRACT

A ring oscillator has a first logic circuit forming a first loop. The ring oscillator also has a second logic circuit forming a second loop, such that phase interpolation occurs at a node common to the first and second loops. The phase interpolation results in an output signal with a high frequency.

24 Claims, 11 Drawing Sheets

US 7,135,935 B2

HYPER-RING OSCILLATOR

This application claims priority from Korean patent application number P2003-64241 filed Sep. 16, 2003 that we incorporate herein by reference.

BACKGROUND OF THE INVENTION

1. Field of the Invention

The present invention relates to a ring oscillator and associated method.

2. Description of the Related Art

Circuits that require internal clocks may use a clock generator to generate periodic signals that may be used as the clock. Alternatively, the clock generator may produce periodic signals that are converted to slower clocks, using a counter or other means to divide the frequency. In yet another application, the clock generator may be used as a phase-locked loop for a clock generator for a memory device.

For example, dynamic memories require refresh signals to ensure that leakage in the memory cells does not cause the memory cells to lose their data. A clock generator may be used to generate a periodic refresh signal. In some examples, the periodic signal is fed to a counter, and after a predetermined number of counts, the counter may output a refresh signal.

One circuit that may be used to generate the periodic signal is a ring oscillator. Examples of these types of oscillators can be found in exemplary U.S. Pat. No. 6,100,763, issued on Aug. 8, 2000, and U.S. Pat. No. 5,250,914, issued Oct. 5, 1993. Generally, these approaches involve a single loop circuit of an odd-number of inverters. As the output signal is fed back to the inputs of the loop, the output signal is inverted, resulting in a signal that varies between a high and a low signal. This causes a periodic signal with a well-defined and stable cycle. The period of the output signal may be decreased, therefore increasing the frequency, by increasing the power in magnitude. This provides for an adjustable frequency.

In another approach, is found in S. J. Lee, "A Novel High-Speed Ring Oscillator for Multiphase Clock Generation using Negative Skewed Delay Scheme," IEEE Journal of Solid-State Circuits, February 1997, pp. 289–291. Lee uses a skewed delay scheme to employ signals of differing phases to generate a multiphase signal. However, the approach does not generate a signal that provides a much faster signal than the prior art.

As memory and other technology evolves, a faster oscillating clock signal is needed for such tasks as refresh signals, system clocks, phase-locked loops, etc. The above solutions, as well as others in the current state of the art, do not provide signals that have a high enough frequency to keep up with the emerging circuit technologies.

BRIEF DESCRIPTION OF THE DRAWINGS

The foregoing and other objects, features, and advantages of the invention will become more readily apparent from the detailed description of an embodiment that references the following drawings.

DETAILED DESCRIPTION OF THE PREFERRED EMBODIMENT

Figure 1A:
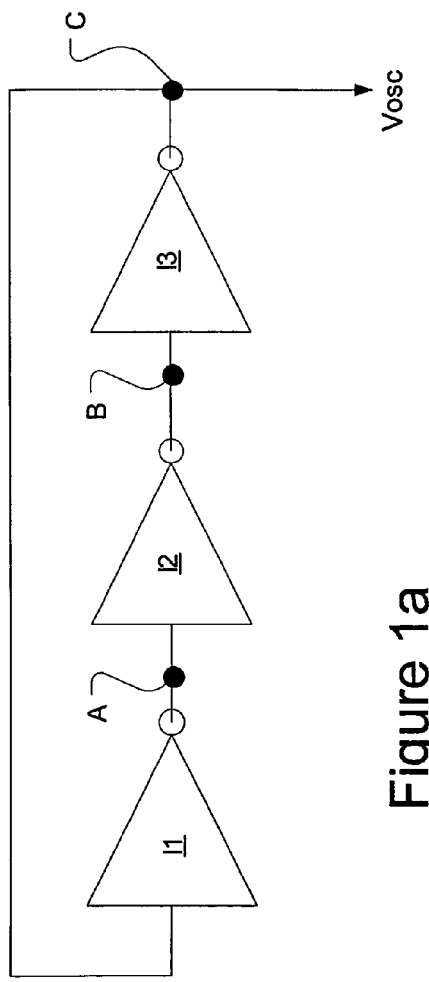
FIGS. 1a–b show prior art embodiments of ring oscillators.
Figure 1B:
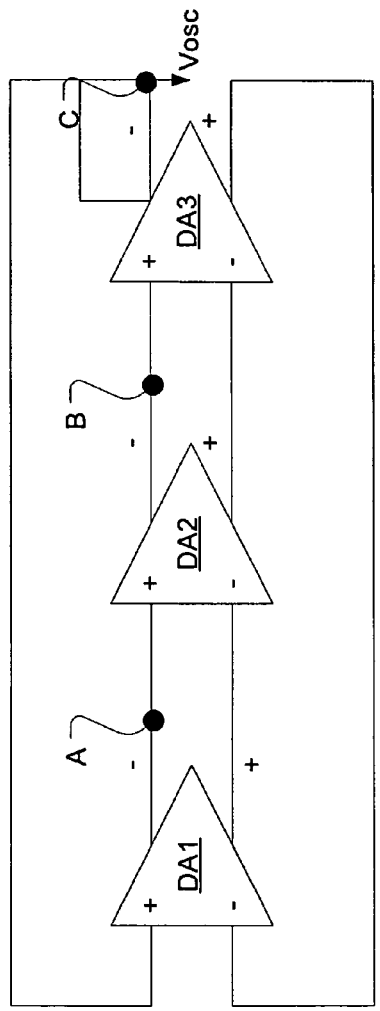

FIG. 1 shows a prior art embodiment of a ring oscillator. As can be seen, the output Vosc is return to the inverter I1, causing the signal to toggle between high and low levels. The period of this signal corresponds to the delay caused by the processing of the signals by the inverters. An alternative embodiment of prior art ring oscillators is shown in FIG. 1b, using differential amplifiers instead of inverters. Regardless of the implementation, such as inverters or differential amplifiers, these components will be referred to as inverting stages. Each embodiment of FIGS. 1a and 1b has three inverting stages. The overall period of the toggle between the high and low signals is determined by the number of stages and the delay at each stage.

Figure 2:
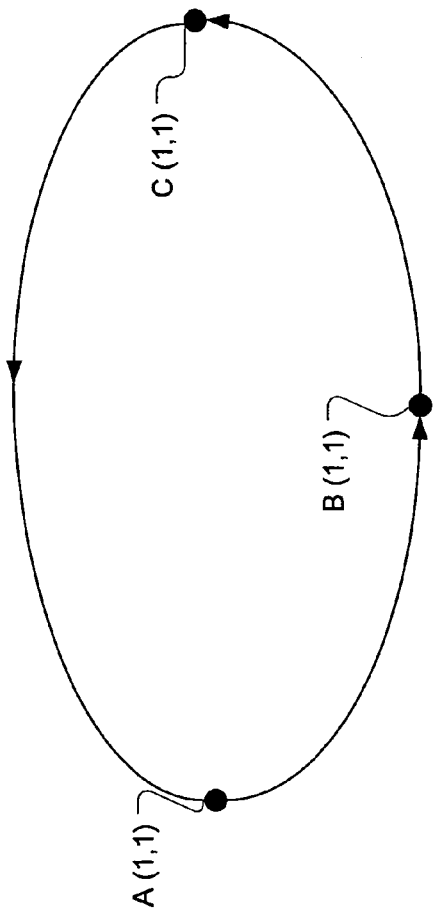
FIG. 2 shows a diagram of input/output signals at the nodes of a prior art embodiment of a ring oscillator.

Looking at the nodes A, B and C, in either FIGS. 1a or 1b, one can determine the number of input and output signals at each node. FIG. 2 shows a nodal analysis, showing that there is one input and one output signal per node. It is possible to use phase mixing between different signals to cause a resulting signal having a period much less than that of the ring oscillators shown. However, in the prior art embodiments, there is no phase mixing at any of the nodes and the period of the output signal remains fixed by the number of inverting stages between the input and output signals.

Figure 3:
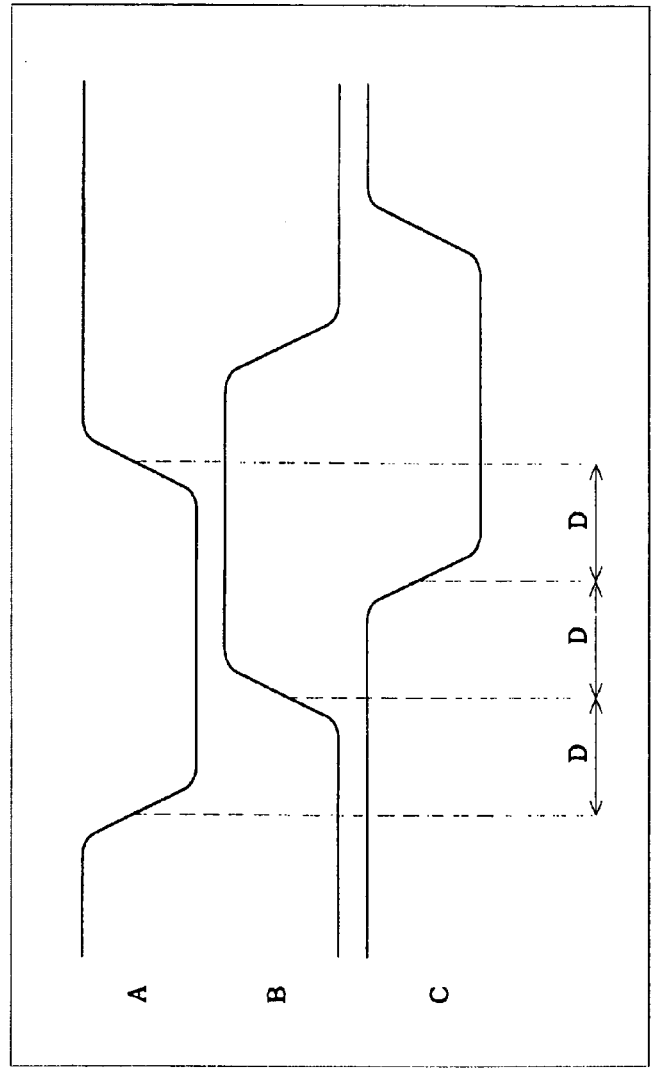
FIG. 3 shows a timing diagram of a prior art embodiment of a ring oscillator.

A timing diagram corresponding to the prior art embodiments of the oscillators is shown in FIG. 3. When a width/length size of each inverter is the same, the delay time, D, between the input signal falling edge, and the output signal rising edge between the nodes A and B is substantially identical with the delay time, D, between the input signal rising edge and the output signal falling edge between the nodes B and C. The delay time between the nodes is almost the same. This results in the periodic output signal with the limitations discussed above.

Figure 4:
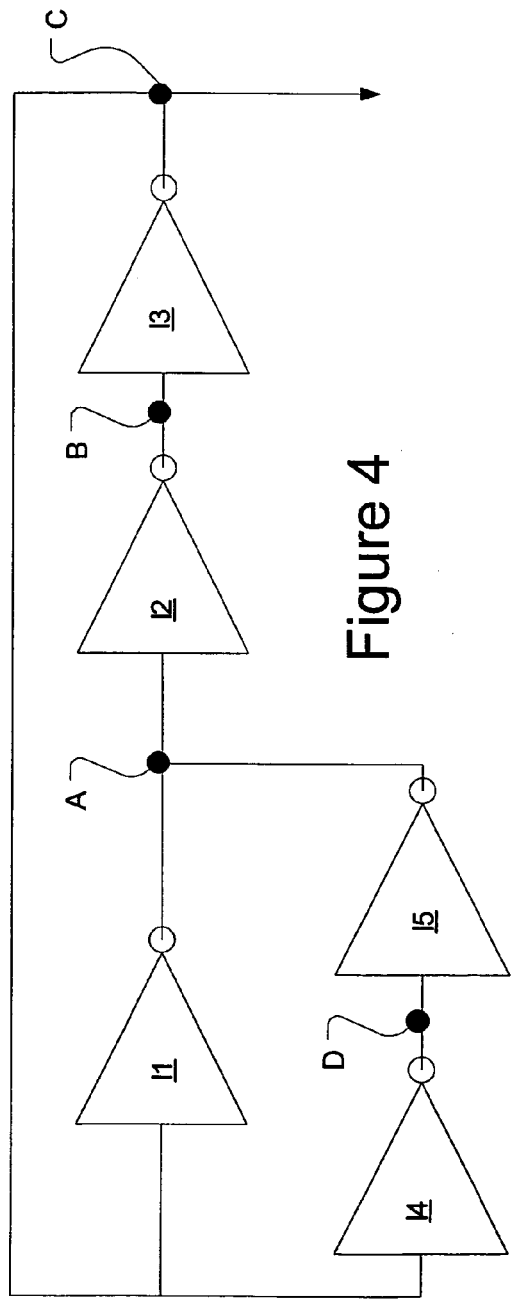
FIG. 4 shows an embodiment of a ring oscillator.
Figure 5:
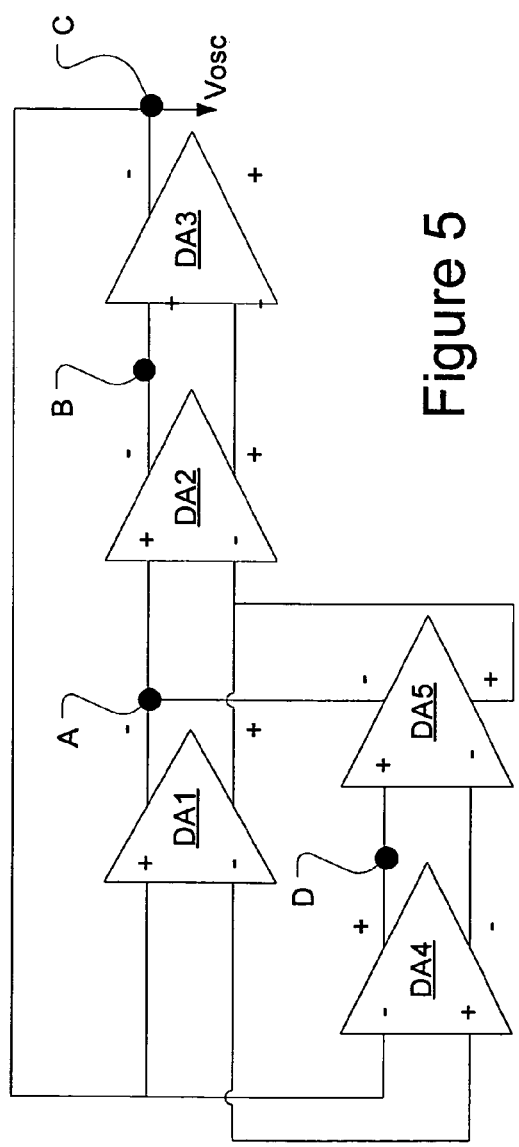
FIG. 5 shows an alternative embodiment of a ring oscillator.

An embodiment of the invention is shown in FIG. 4 that has phase mixing of output signals resulting in a signal having a shorter period and a higher frequency without significantly increasing the complexity of the circuit. An alternative embodiment of the invention is shown in FIG. 5. FIG. 4 shows an embodiment employing inverters as the inverting stages, while the embodiment of FIG. 5 employs differential amplifiers as inverting stages. The particular component used as inverting stages is not limited in any way by these examples, but is familiar components that allow clearer demonstration of the invention.

The circuit has two circuit loops, a first circuit loop through inverters I1, I2 and I3, and a second circuit loop through I4, I5, I2 and I3. The signals from the 2 loops mix at node A. At this node, the output signal from node C has traversed two inverting stages for the second loop, and only one inverting stage from the first loop. Because of the variation between the signals at node A, phase mixing occurs. Phase mixing, as used here, means a mixing of at least two signals of different phases at the same node.

Figure 6:
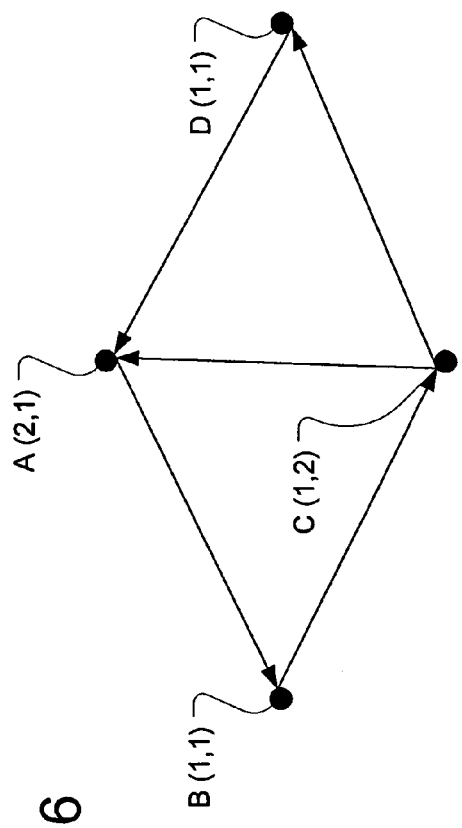
FIG. 6 shows a diagram of input/output signals at the nodes of a prior art embodiment of a ring oscillator.

A nodal analysis of the embodiments of FIG. 4 and FIG. 5 is shown in FIG. 6. As can be seen here, nodes B and D each have one input and one output. Node B outputs a signal to node C and receives an input signal from node A. Node D receives an output signal from node C and provides an input signal to node A. Unlike the prior art, node C provides two output signals, one to node A and one to node D, and receives an input signal from node B. Also unlike the prior art, node A receives two input signals, one from node D and one from node C, and outputs one output signal to node B.

Figure 7A:
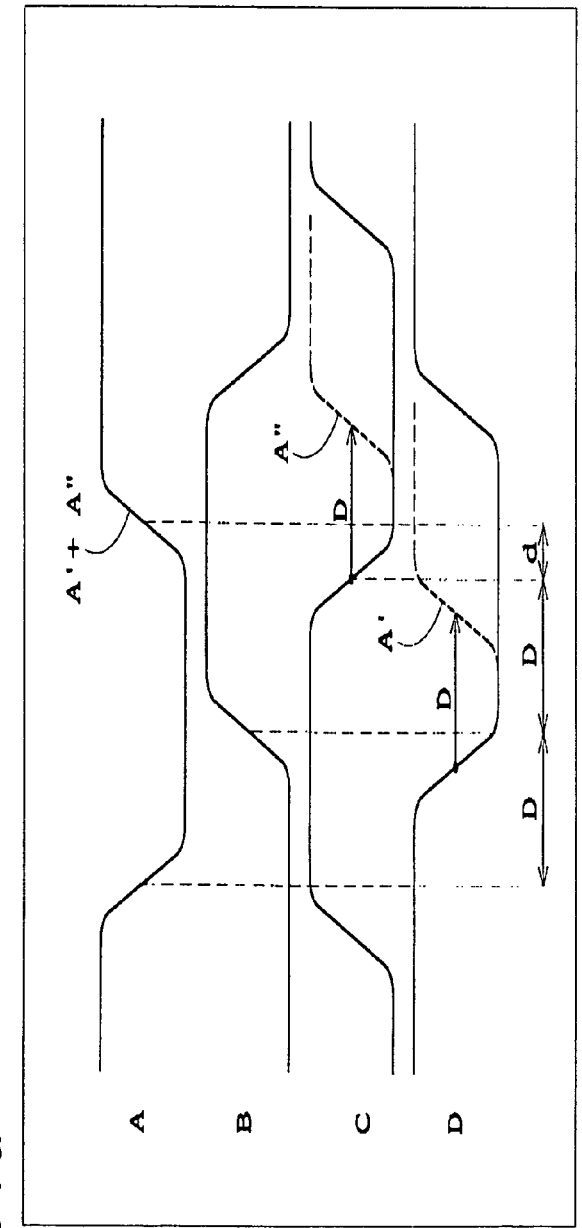
FIGS. 7a–7b show timing diagrams of the signals at the nodes of a ring oscillator.

Receiving 2 input signals of different phases is what causes the phase mixing at node A. A timing diagram for the resulting signals is shown in FIG. 7a. The delay time, D, between the input signal falling edge and the output signal rising edge between nodes A and B is the same as the delay time, D, between the input signal rising edge and the output signal falling edge between nodes B and C. The delay time, d, between the falling time of C and the rising time of A is smaller than the delay time D. This is because the input signals A' and A" are interpolated at this node. The signal A' is an inverted signal of a signal D through the inverter I5 and the signal of A" is an inverted signal of a signal C through the inverter I1. The delay time between nodes can be controlled by a different value per node when a ring oscillator is implemented by at least two loops.

Figure 7B:
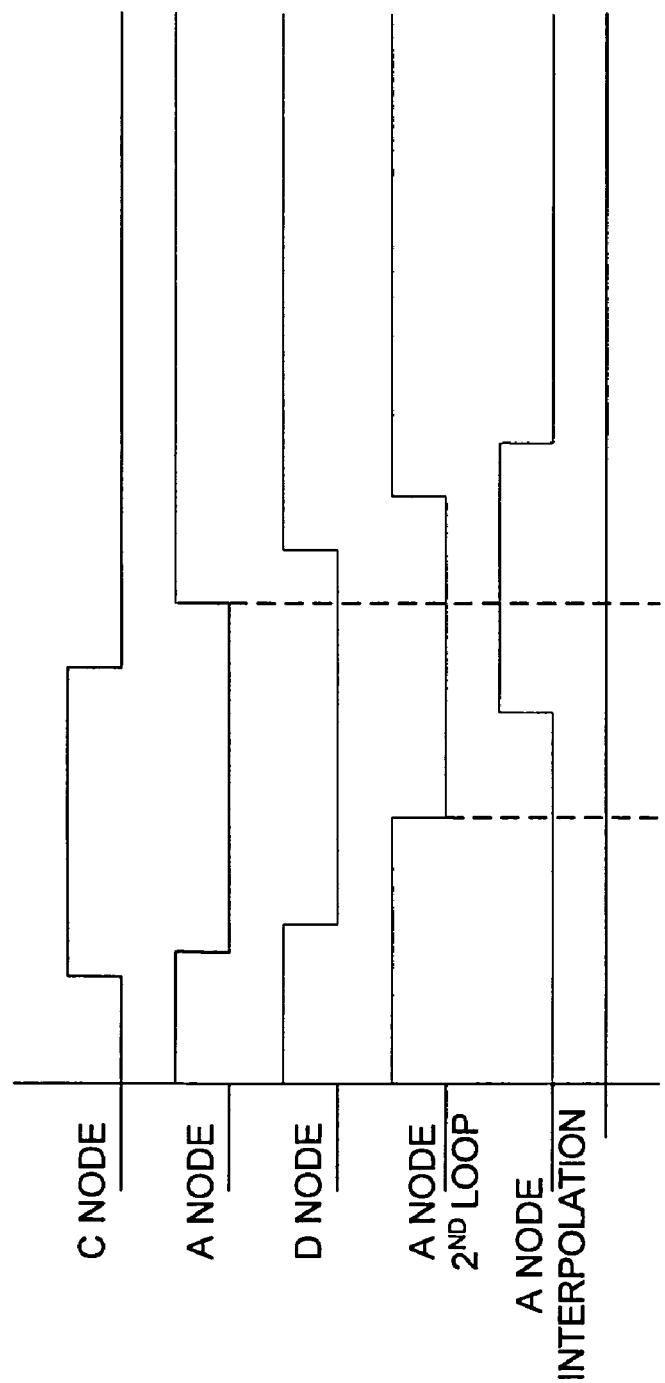

The nodal analysis may be more easily understood by looking at a timing diagram of the signals at the various nodes, shown in FIG. 7b. When the signal from node C is high, the signal at node A goes through a delay and then goes low through the first loop. The signal at node D is also low. The signal at node A goes high from the inverter I5. The interpolated signal at A node is shown on the final line. As can be seen between the two dotted lines, the interpolated signal has a shorter period.

Figure 8A:
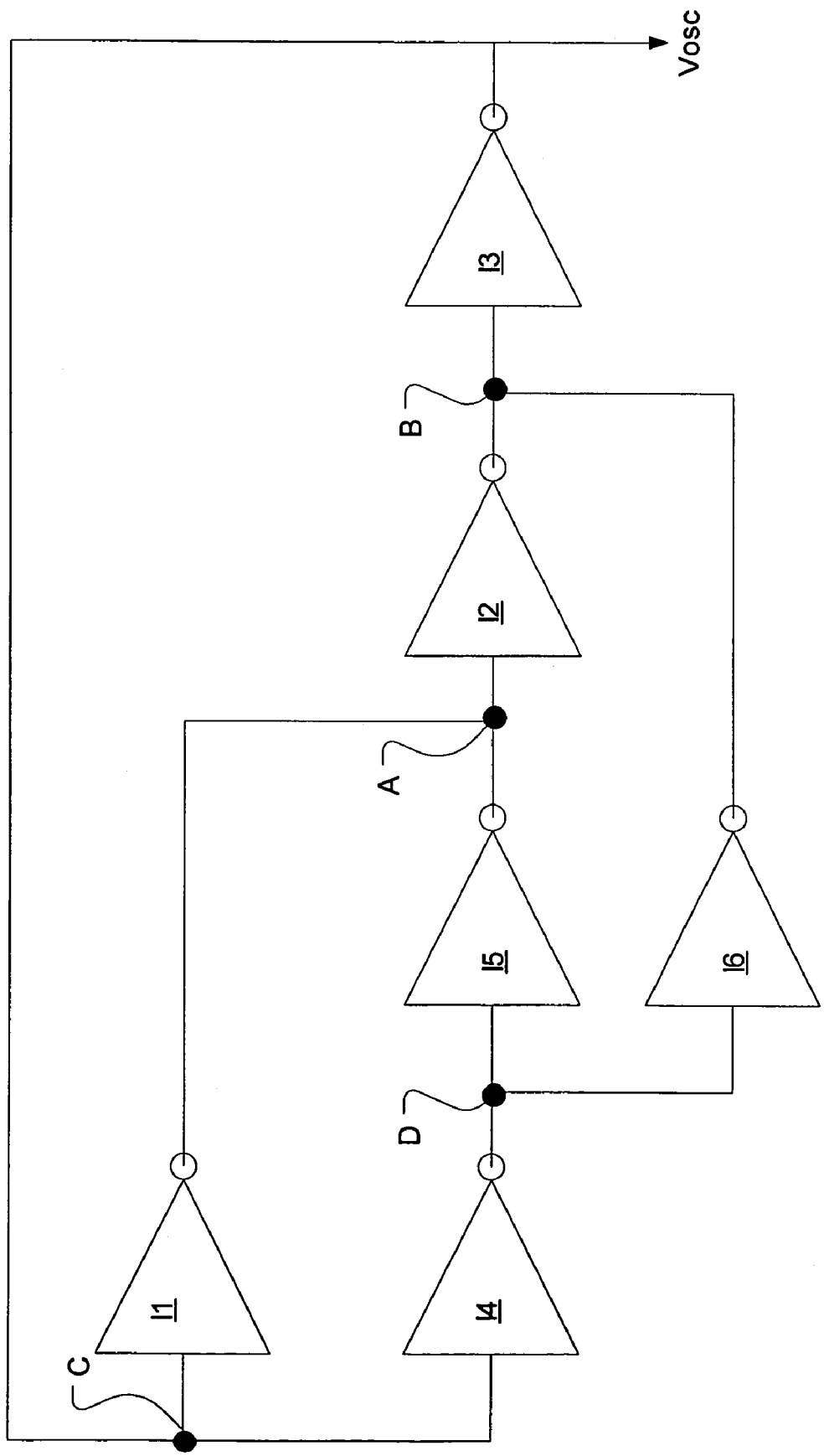
FIGS. 8a–c show an alternative embodiment of a ring oscillator, an input/output signal diagram and a timing diagram.

An alternative embodiment of the invention is shown in FIG. 8a. FIG. 8a has three loops. Like the embodiment of FIG. 6, the first circuit loop has an odd number of inverting stages, and the second circuit loop has an even number of inverting stages. The overall resulting number of inverting stages should generally be an odd number to produce the desired oscillating signal. In the embodiment of FIG. 8a, a third loop has been added with an odd number of inverting stages.

In this embodiment, the first circuit loop consists of three inverting stages I1, I2 and I3. The second circuit loop consists of four inverters I4, I 5, I2 and I3. A third circuit loop consists of three inverting stages I3, I4 and I6 between nodes B, C, D and B. In this embodiment, phase interpolation occurs at nodes A and B. At node A, the two input signals come from the inverter I1 and the inverter I5. At node B, the two input signals come from the inverter I2 and the inverter I6. This results in a frequency of the output pulse faster than before.

Figure 8B:
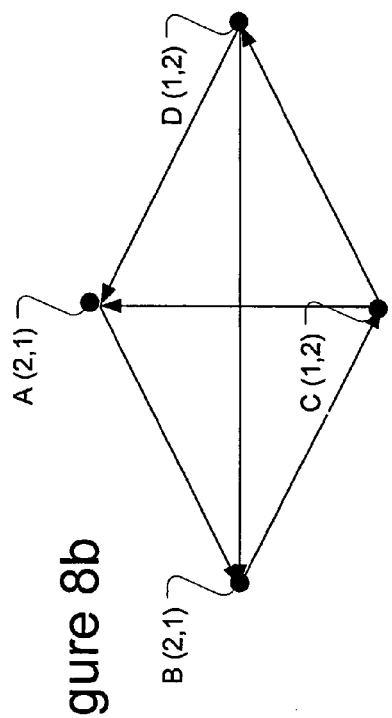
Figure 8C:
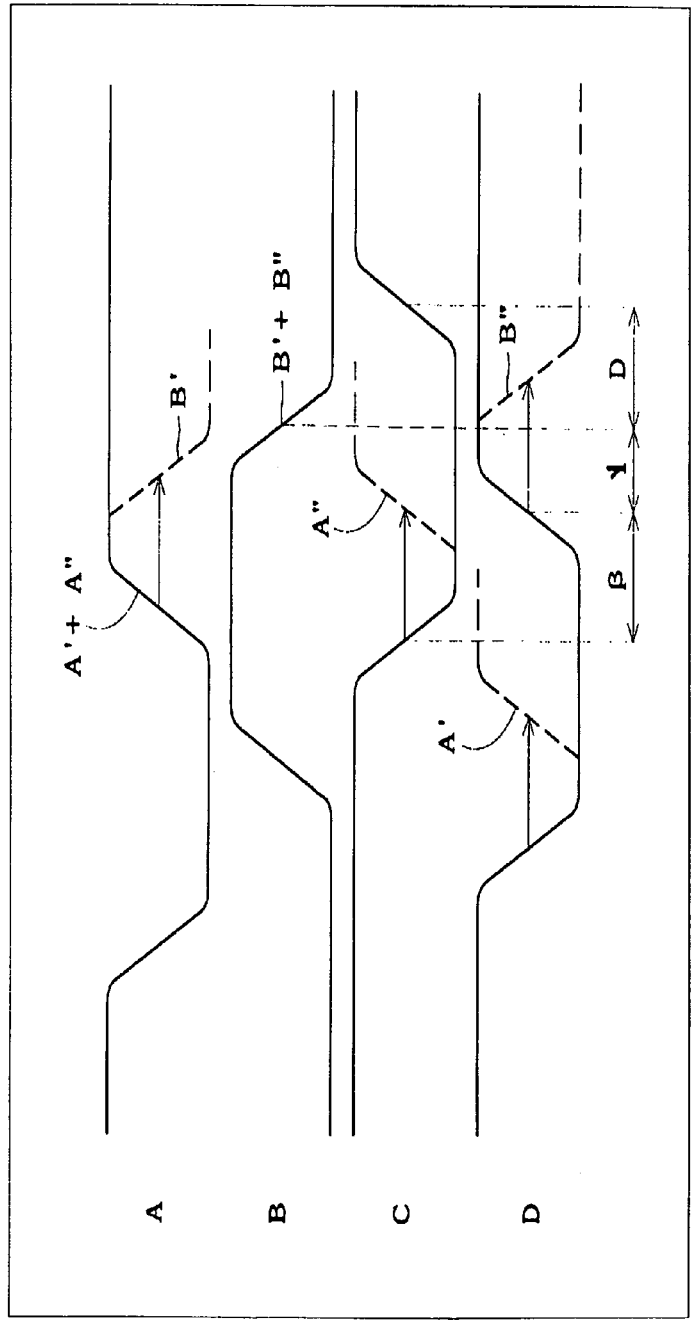

As can be seen by the nodal analysis in FIG. 8b, both nodes A and B receive two in put signals. Similarly, the timing diagram of FIG. 8c shows the resulting signals from the interpolation at 2 nodes. The rising or falling time of an oscillation pulse at each of the nodes A and B is faster than one of the oscillation pulses at nodes C and D. The frequency of the output pulse is faster due to the shorter delay at the two nodes. This results in an even faster output signal than before.

Figure 9A:
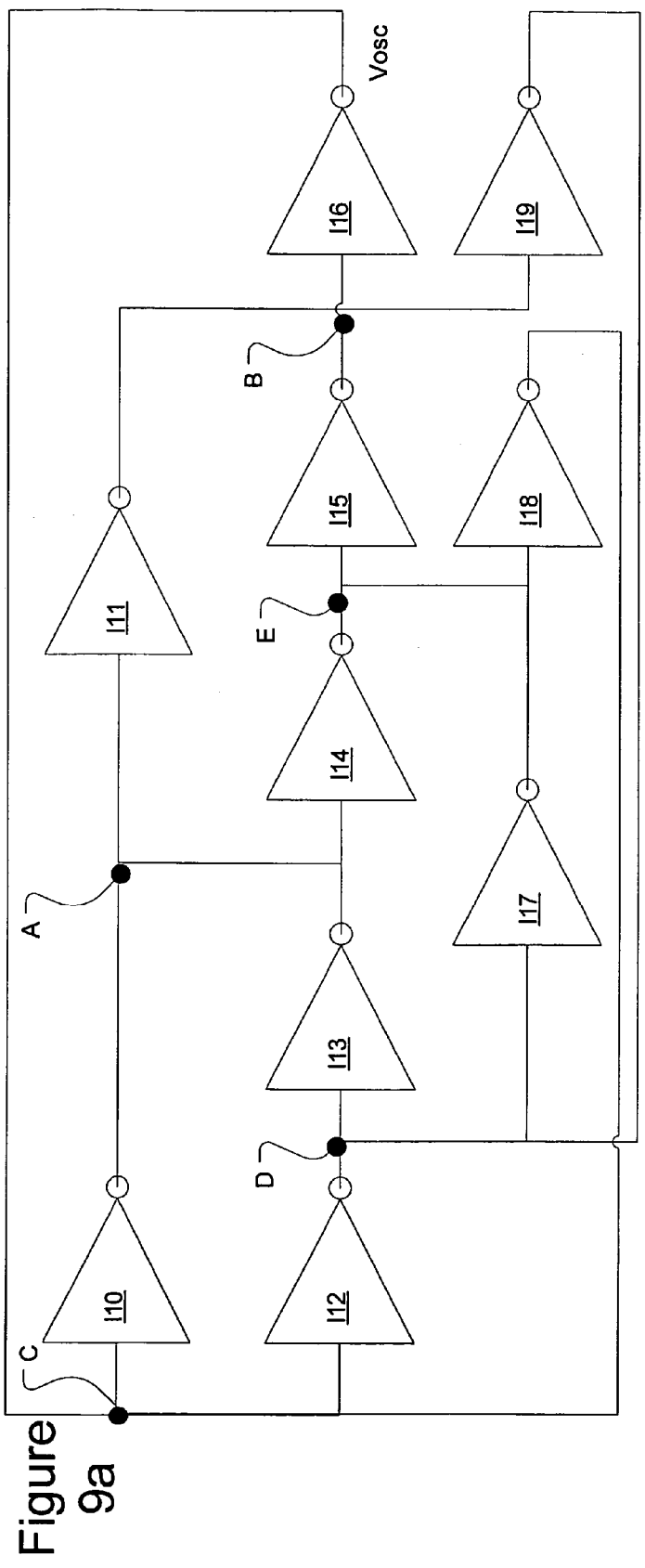
FIGS. 9a and 9b show an alternative embodiment of a ring oscillator and a corresponding input/output signal diagram.
Figure 9B:
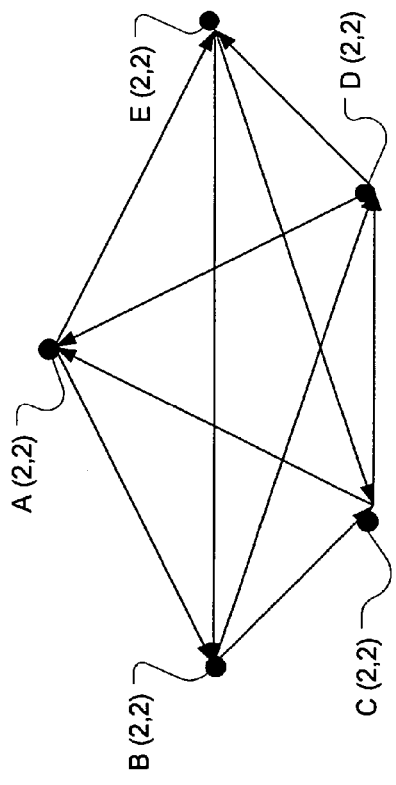

Another embodiment employing phase interpolation at all nodes is shown in FIG. 9a. The output pulse has the fastest frequency of any of the embodiments shown herein. Phase mixing at all nodes would seem the most desirable, unless that high speed of a pulse is not needed. Design trade-offs between speed and circuit complexity may result in interpolation at less than all nodes being more desirable, if that interpolation results in an output pulse having a frequency that is high enough to be sufficient for the needs of the system. However, generally, the output signal with the highest frequency will be considered to be more desirable.

The nodal analysis of the circuit of FIG. 9a is shown in 9b. As can be seen, all nodes receive two input signals and produce two output signals. The phase interpolation or mixing occurs at the two input signals at every node. The output signals will typically not be implemented as two actual output signals. They will generally be one output signal provided in such a manner as to be sent on two lines. The output of inverter I14, for example, is one output signal, it is merely provided to the inputs of inverters I15 and I18, and is therefore referred to as 2 output signals.

Figure 10A:
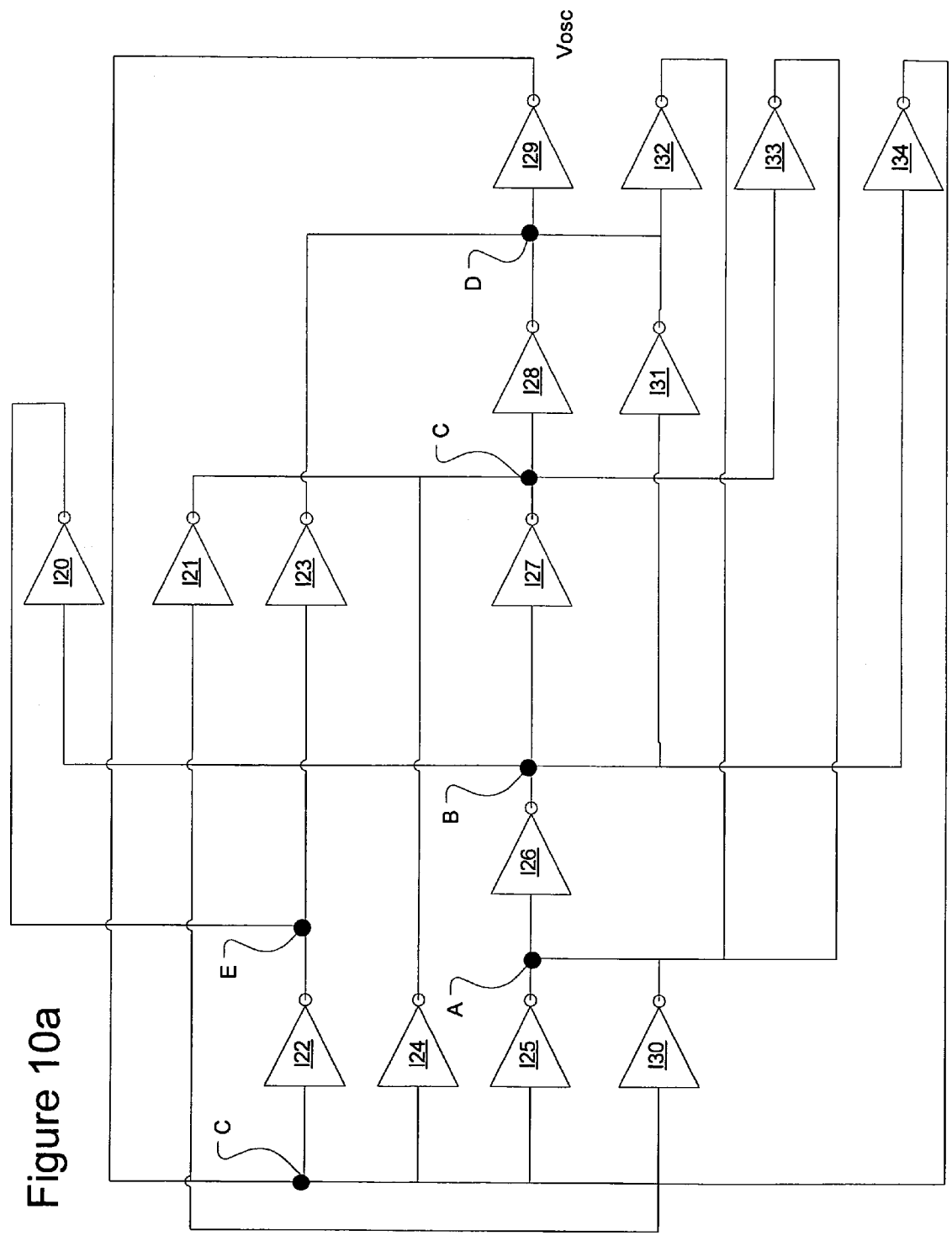
FIGS. 10a and 10b show an alternative embodiment of a ring oscillator and a corresponding input/output signal diagram.
Figure 10B:
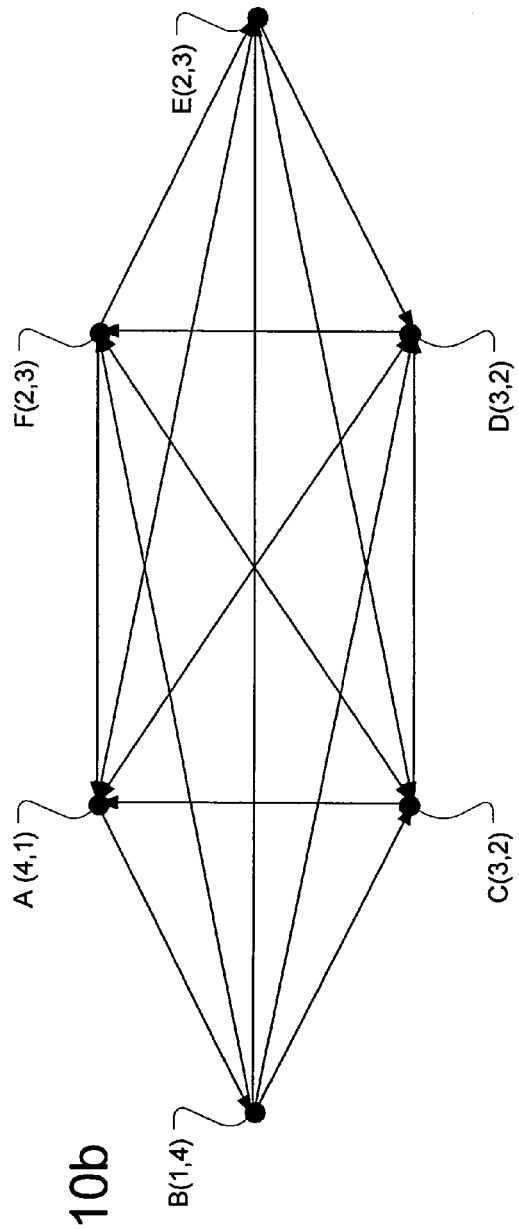

Up to this point in the discussion, the phase mixing has been of two signals at a particular node. In the embodiment of FIG. 10a, phase mixing occurs using four input signals. For example, at node A, there are four input signals received from each of four inverters I25, I30, I32 and I33. These four input signals are used in the interpolation, resulting in phase mixing of the four input signals for a resulting output signal having a high frequency.

Figure 11:
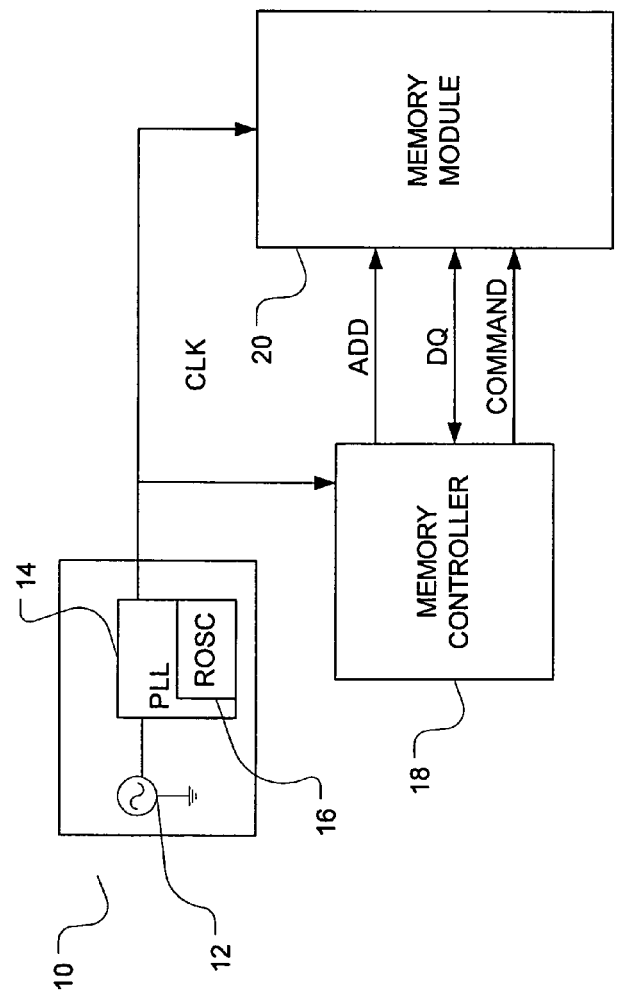
FIG. 11 shows an embodiment of a system having a clock generator employing a ring oscillator as a phase-locked loop.

In this manner, the phase mixing allows for a faster output signal that can be used in many different applications. For example, a memory system may use the high frequency output signal as a phase-locked loop in a clock generator used to generate an internal clock for an output buffer or to refresh the memory or to clock addresses or to data access for the memory. An example of such a system is shown in FIG. 11. The clock generator 10 has a pulse generator 12 and a phase-locked loop 14 that employs a ring oscillator 16 in accordance with any of the embodiments of the invention above.

Figure 12:
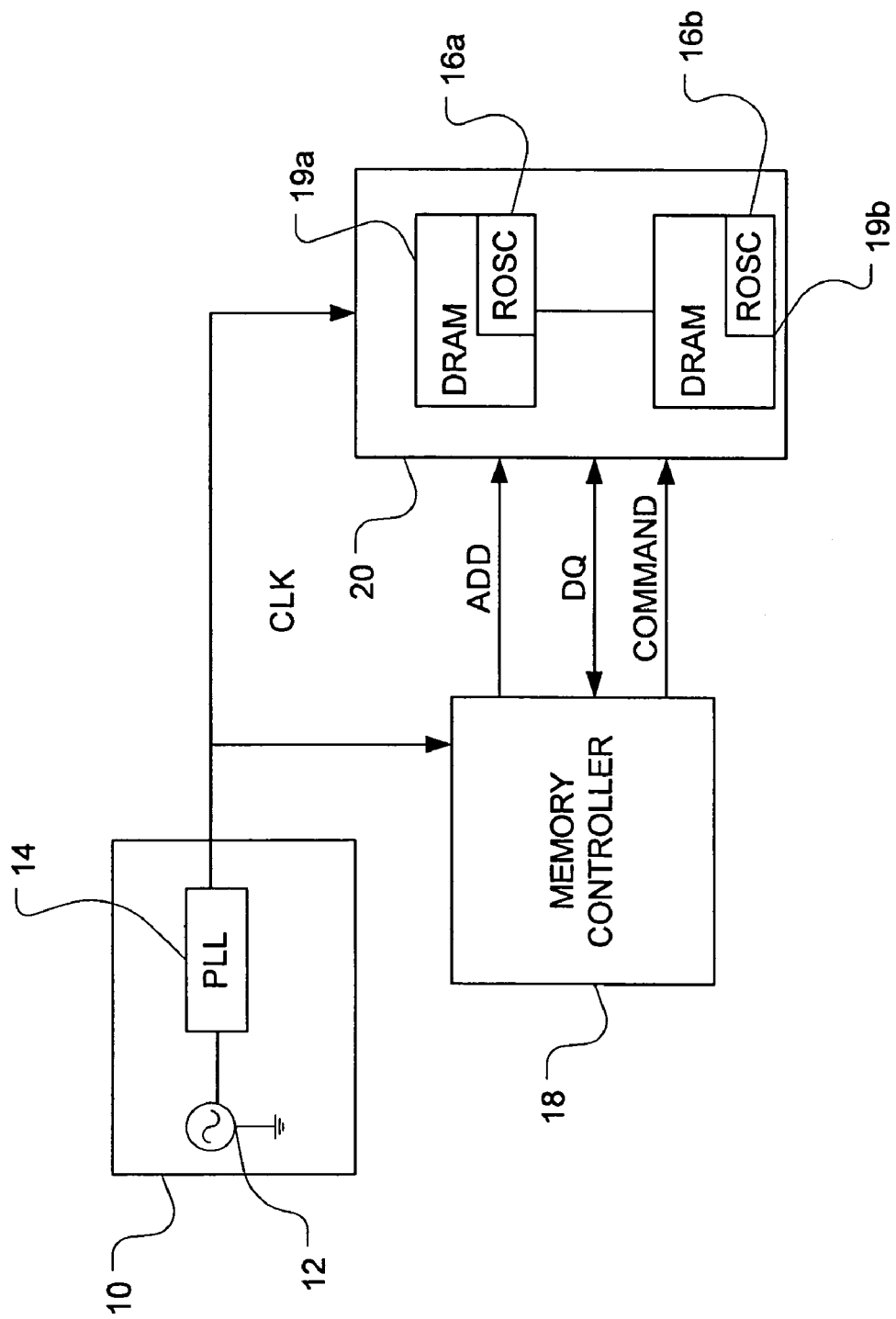
FIG. 12 shows an alternative embodiment of a system having a ring oscillator.

An alternative embodiment of the system is shown in FIG. 12. In FIG. 12, the ring oscillator is made a part of the DRAM devices 19a and 19b, as ring oscillators 16a and 16b, within the memory module 20. The memory module 20 may comprise a plurality of memory devices 19a and 19b. In this embodiment, the PLL is located in the memory device that mounted the memory module 20. A DLL (Delay Locked Loop) located at the memory device may also include the Ring Oscillator according to this invention. The resulting clock signal is then provided to the memory controller 18 and the memory module 20, and the resulting clock signal of PLL (or DLL) may be provided to an output buffer located at the memory device.

Having illustrated and described the principles of the embodiments of this invention, it should be readily apparent to those skilled in the art that the invention can be modified in arrangement and detail without departing from such principles. All modifications coming within the spirit and scope of the accompanying claims are claimed.

I claim:

1. A ring oscillator, comprising:
   a first logic circuit forming a first loop having a first input element;
   a second logic circuit forming a second loop having a different input element than the first input element, such that phase interpolation occurs at a node common to the first and second loops to produce a first oscillation signal;
   a third logic circuit forming a third loop having an odd number of inverting stages, such that the phase interpolation occurs at a second node, the second node being common to the second and third loops to produce a second oscillation signal having a frequency higher than the first oscillation signal.

2. The ring oscillator of claim 1, the first logic circuit further comprising an at least one circuit element shared with the second logic circuit.

3. The ring oscillator of claim 2, the circuit element is composed of an inverter or a differential amplifier.

4. The ring oscillator of claim 1, the first logic circuit further comprising an odd number of inverting stages and the second logic circuit further comprising an even number of inverting stages.

5. The ring oscillator of claim 4, the inverting stages further comprising inverters.

6. The ring oscillator of claim 4, the inverting stages further comprising differential amplifiers.

7. A ring oscillator, comprising:
   a first logic circuit forming a first loop having a first odd number of inverting stages and a first input element;
   a second logic circuit forming a second loop having an input element other than the first input element, such that phase interpolation occurs at a first node common to the first and second loops to produce a first oscillation signal; and
   a third logic circuit forming a third loop having a second odd number of inverting stages, such that the phase interpolation occurs at a second node, the second node being common to the second and third loops to produce a second oscillation signal having a frequency higher than the first oscillation signal.

8. The ring oscillator of claim 7 comprising at least two additional circuit loops arranged such that phase interpolation occurs at least three different nodes.

9. The ring oscillator of claim 7 comprising a phase-locked loop.

10. A ring oscillator, comprising:
    first, second and third circuit loops, wherein each loop has a different input element from the other loops; and
    a node common to the first and second circuit loops at which phase interpolation occurs, producing a first oscillating signal having a frequency higher than an oscillating signal provided by the first loop independently; and
    a second node at which phase interpolation occurs, the oscillator producing an oscillating signal having a frequency higher than the first oscillating signal.

11. A ring oscillator comprising:
    a first node located at a common output of first and second circuit loops, wherein the first and second loops have different input elements, phase interpolation to occur at the first node to produce a first oscillation signal;
    a third circuit loop arranged such that a second node is common to the second and third circuit loops and at which phase interpolation occurs to produce a second oscillation signal having a frequency higher than the first oscillation signal, the second node located one inverting stage prior to the first node;
    a third node located one inverting stage after the first node; and
    a fourth node, located so as to be common to at least two circuit loops and such that phase interpolation occurs at the fourth node.

12. The ring oscillator of claim 11, the first circuit loops further comprises at least one circuit element shared with the second circuit loops.

13. The ring oscillator of claim 11 further comprising at least two additional circuit loops arranged such that at least three nodes are common to at least two of the loops and that phase interpolation occurs at each node of the three nodes.

14. A method comprising:
    producing a first output signal having a first phase at a first node from a first circuit loop having a first input element;
    producing a second output signal having a second phase at the first node from a second circuit loop having an input element other than the first input element;
    producing a third output signal having a third phase at a second node;
    interpolating the first and second phases at the first node to produce a first resulting output signal having an output frequency higher than a frequency of the first output signals; and
    interpolating the third output signal with at least one of the first and second output signals at the second node, causing a second resulting output signal to have a frequency higher than the first resulting output signal.

15. A system comprising:
    a memory controller generating a plurality of command and address signals;
    a memory module comprising a plurality of memory devices and receiving the plurality of command and address signals from the memory controller;
    each of the memory devices to store data comprising;
    a plurality of memory cells to store the data;
    a ring oscillator operating for a phase locked loop, the ring oscillator comprising;
      a first logic circuit forming a first loop having a first input element; and
      a second logic circuit forming a second loop having a different input element than the first input element, such that phase interpolation occurs at a node common to the first and second loops to produce a first oscillation signal; and
      a third logic circuit forming a third loop to produce a third output signal having a third phase at a second node such that phase interpolation occurs at the second node to produce a second output signal having a frequency higher than the first resulting output signal.

16. The system of claim 15, the memory device further comprising one selected from the group comprised of: a static random-access memory, a dynamic random-access memory, and a read-only memory.

17. The system of claim 15, the first logic loop further comprising an odd number of inverting stages.

18. The system of claim 15, the second logic circuit further comprising an even number of inverting stages.

19. The system of claim 17, the inverting stages further comprising inverters.

20. The system of claim 17, the inverting stages further comprising differential amplifiers.

21. The system of claim 18, the inverting stages further comprising inverters.

22. The system of claim 18, the inverting stages further comprising differential amplifiers.

23. A system comprising:
- a memory controller generating a plurality of command and address signals and receiving a first clock signal;
- a memory module comprising a plurality of memory devices and receiving the plurality of command and address signals from the memory controller;
- a clock generator generating the first clock signal and transferring the first clock signal to the memory controller, the clock generator comprising a clock source and a phase locked loop including a ring oscillator;
- the ring oscillator comprising:
  - a first logic circuit forming a first loop having a first input element;
  - a second logic circuit forming a second loop having a different input element than the first input element, such that phase interpolation occurs at a node common to the first and second loops producing a first output signal;
  - a third logic circuit forming a third loop producing a third output signal having a third phase at a second node; and
  - interpolating the third output signal with at least one of the first and second output signals at the second node, causing a second output signal to have a freciuency higher than the first output signal.

24. The system of claim 23, the clock generator being directly mounted on a motherboard.

* * * * *